(12) United States Patent
Murata

(10) Patent No.: US 7,501,915 B2
(45) Date of Patent: Mar. 10, 2009

(54) HIGH FREQUENCY MODULE

(75) Inventor: Ryuji Murata, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 164 days.

(21) Appl. No.: 11/589,419

(22) Filed: Oct. 30, 2006

(65) Prior Publication Data

US 2007/0103257 A1    May 10, 2007

(30) Foreign Application Priority Data

Nov. 1, 2005   (JP)   ............................. 2005-317995

(51) Int. Cl.
*H03H 7/00* (2006.01)
*H01P 7/00* (2006.01)
(52) U.S. Cl. ..................... 333/185; 333/172; 333/175
(58) Field of Classification Search ................ 333/172, 333/175, 185, 219
See application file for complete search history.

(56) References Cited

U.S. PATENT DOCUMENTS 7,190,970 B2 *  3/2007  Ochii et al. ............... 455/553.1
7,356,349 B2 *  4/2008  Furutani et al. .......... 455/552.1

* cited by examiner

*Primary Examiner*—Dean O Takaoka
(74) *Attorney, Agent, or Firm*—Knobbe Martens Olson & Bear LLP

(57) ABSTRACT

A high frequency module reduces the inhibition in magnetic flux generated in an inductor and stray capacitance while simultaneously attaining shorter height and smaller size. The high frequency module includes a passive circuit having an inductor and a capacitor. One component part of the passive circuit is mounted as an electronic part on the substrate, while the other component part f the passive circuit is formed within the substrate. A ground electrode is further provided between the one component part of the passive circuit and the other component part.

17 Claims, 10 Drawing Sheets

HIGH FREQUENCY MODULE

BACKGROUND

1. Field of the Invention

The present invention relates to a high frequency module mainly used for a high frequency mobile communication machine such as a cellular phone and PDA (Personal Digital Assistant).

2. Description of the Related Technology

Conventionally, in a high frequency module using an LTCC (Low Temperature Co-fired Ceramic) substrate, a dielectric passive circuit such as a filter is generally formed only within the LTCC substrate. For example, a configuration example of high frequency module when a bandpass type filter formed by an equivalent circuit shown in FIG. 7 is formed within an LTCC substrate is as shown in FIG. 8.

The equivalent circuit shown in FIG. 7 is a bandpass type filter, and two LC resonance circuits are connected between an input terminal P1 and an output terminal P2 by coupling capacitors C1 to C3. One LC resonance circuit is formed by serially connecting an inductor RL1 and a capacitor RC1, and one end of the inductor RL1 is connected to the coupling capacitors C1, C2 and the other end of the capacitor RC1 is grounded. The other LC resonance circuit is formed by serially connecting an inductor RL2 and a capacitor RC2, and one end of the inductor RL2 is connected to the coupling capacitors C2 and C3 and the other end of the capacitor RC2 is grounded.

Further, a high frequency module 30 shown in FIG. 8 includes an LTCC substrate 33 on which electronic parts 31, 32 are mounted, and a bandpass type filter circuit 34 is formed within the LTCC substrate 33.

Furthermore, when it is necessary to prevent the interference with other lines, sometimes GND (ground) electrodes 44 are formed within the LTCC substrate 33 as in a high frequency module 30A shown in FIG. 9, and a passive circuit formed in an inner layer is shielded to the electronic parts 31, 32 and power supply lines (not shown) mounted on the substrate 33 by the GND electrodes 44.

In FIG. 9, an input terminal P1 is formed by an electrode 41 and an output terminal P2 is formed by an electrode 42. Further, a capacitor C1 is formed by an inductor electrode 52 that is located with one end thereof facing an capacitor electrode 51, an inductor RL1 is formed by the inductor electrode 52, and a capacitor RC1 is formed by a capacitor electrode 53 that is located facing the other end of the inductor electrode 52 and connected to the GND electrode 44 through a via conductor 43.

Furthermore, a part of a capacitor C2 is formed by a capacitor electrode 54 that is located facing the one end of the inductor electrode 52 and another part of the capacitor C2 is formed by a capacitor electrode 55 that is located facing one end of an inductor electrode 56 and connected to the capacitor electrode 54 through the via conductor 43. Moreover, an inductor RL2 is formed by the inductor electrode 56, and a capacitor RC2 is formed by a capacitor electrode 57 that is located facing the other end of the inductor electrode 56 and connected to the GND electrode 44 through the via conductor 43. Further, a capacitor C3 is formed by a capacitor electrode 58 that is located facing the one end of the inductor electrode 56 and connected to the electrode 42 through the via conductor 43.

On the other hand, when the above described passive circuit such as a filter is not formed in the inner layer of the LTCC substrate, as shown in FIG. 10, the passive circuit function such as a filter is realized by configuring the passive circuit such as a filter itself as a single piece of electronic part 61 and mounting the electronic part 61 with another electronic part 62 on an LTCC substrate 63.

As the above described high frequency module, for example, high frequency modules disclosed in JP-A-2005-243785, JP-A-2005-243787, JP-A-2005-244814, etc. are known.

However, regarding high frequency modules, demands of markets for downsizing, especially thinning of modules have been increased. A conventional high frequency module using a dielectric substrate such as an LTCC substrate has a structure in which surface mounted components are mounted on the substrate, and the height of the high frequency module is determined by the total of thicknesses of the substrate and the surface mounted components.

Accordingly, in order to fulfill the demand for shorter height of the high frequency module, it is necessary to thin both the dielectric substrate such as an LTCC substrate and the surface mounted components. In a dielectric passive circuit device such as a filter or balance filter having characteristics that depend on the thickness of dielectric material, securing of the characteristics with the thinning has become an issue. Further, due to spread of FC (Flip Chip) mounting of semiconductors and downsizing of chip parts for mounting, the surface mounted components have become shorter in height and securing of the characteristics of dielectric passive circuit device of type mounted on the substrate has become harder.

That is, as described above, since the dielectric passive circuit device such as a filter is configured only by a module substrate or surface mounted components, in a high frequency module that simultaneously requires both shorter height and downsizing, there have been problems that a stray effect occurs between the device and a shielding shield for suppressing the interference with other lines, and it becomes difficult to secure the dielectric material thickness for obtaining good characteristics in a distributed constant type circuit having characteristics on which the dielectric material thickness has an influence.

For example, in the conventional structure as shown in FIG. 9, the passive circuit such as a filter is formed only within the dielectric module substrate such as an LTCC substrate. In order to shorten the height of the high frequency module, it is necessary to thin the thicknesses of the surface mounted components and the substrate as much as possible, and inhibition in magnetic flux generated in the inner layer inductor and increase in stray capacitance occur because the distance to the GND shield for shielding the interference with power supply lines, bus lines becomes shorter due to thinning.

SUMMARY OF CERTAIN INVENTIVE ASPECTS

Certain inventive aspects have been achieved in view of the above described problems, and a purpose thereof is to provide a high frequency module capable of reducing the inhibition in magnetic flux generated in an inductor and increase in stray capacitance and simultaneously attain shorter height and downsizing.

In order to achieve the above described purpose, a high frequency module including a passive circuit having an inductor and a capacitor, and an electronic part mounted on a substrate, wherein one component part of the passive circuit is mounted as the electronic part on the substrate, the other component part except the one component part of the passive circuit is formed within the substrate, and a ground electrode is provided between the electronic part as the one component part of the passive circuit and the other component part is proposed.

According to the high frequency module in one inventive aspect, the passive circuit conventionally formed only in the inner layer of the substrate or only in the mounting electronic part on the substrate is divided and formed into a passive circuit in the inner layer of the substrate and a passive circuit of the mounting electronic part.

According to the high frequency module in one inventive aspect, the passive circuit is divided and formed inside and outside of the substrate, and therefore, the passive circuit can be formed by utilizing the entire thickness of the module. The module has a characteristic improvement effect by utilizing the thickness of the entire module for the circuit configuration element such as a stripline resonator that especially and highly depends on the thickness compared to the conventional method of forming the passive circuit only with a substrate inner layer or mounting electronic part on the substrate.

Further, because of the characteristics of the parts that form the passive circuit, the inductor such as a stripline resonator is configured as the mounting electronic part, and therefore, the structural influence by stray capacitance or the like can be reduced, formation of the inner layer and mounting outside of the substrate can be freely set by the circuit configuration of the circuit devices, and the degree of freedom of design can be improved.

Furthermore, magnetic flux generated in the inductor is hardly inhibited by mounting the inductor part as the electronic part on the substrate. Further, when sealed by a shield case or the like, the clearance between the inductor and the shield part is more easily secured compared to the case where the inductor is formed in inner layer of the substrate, and the interference with the magnetic field can be significantly reduced.

Moreover, the passive circuit is divided and formed within the substrate and the external mounting electronic part, and therefore, the volume of the circuit devices is developed in the height direction, and the area for the circuit formation can be reduced and the cost can be reduced due to increase in the number of mold in the assembly formation of the dielectric module substrate such as an LTCC.

DETAILED DESCRIPTION OF CERTAIN EMBODIMENTS

Figure 1:
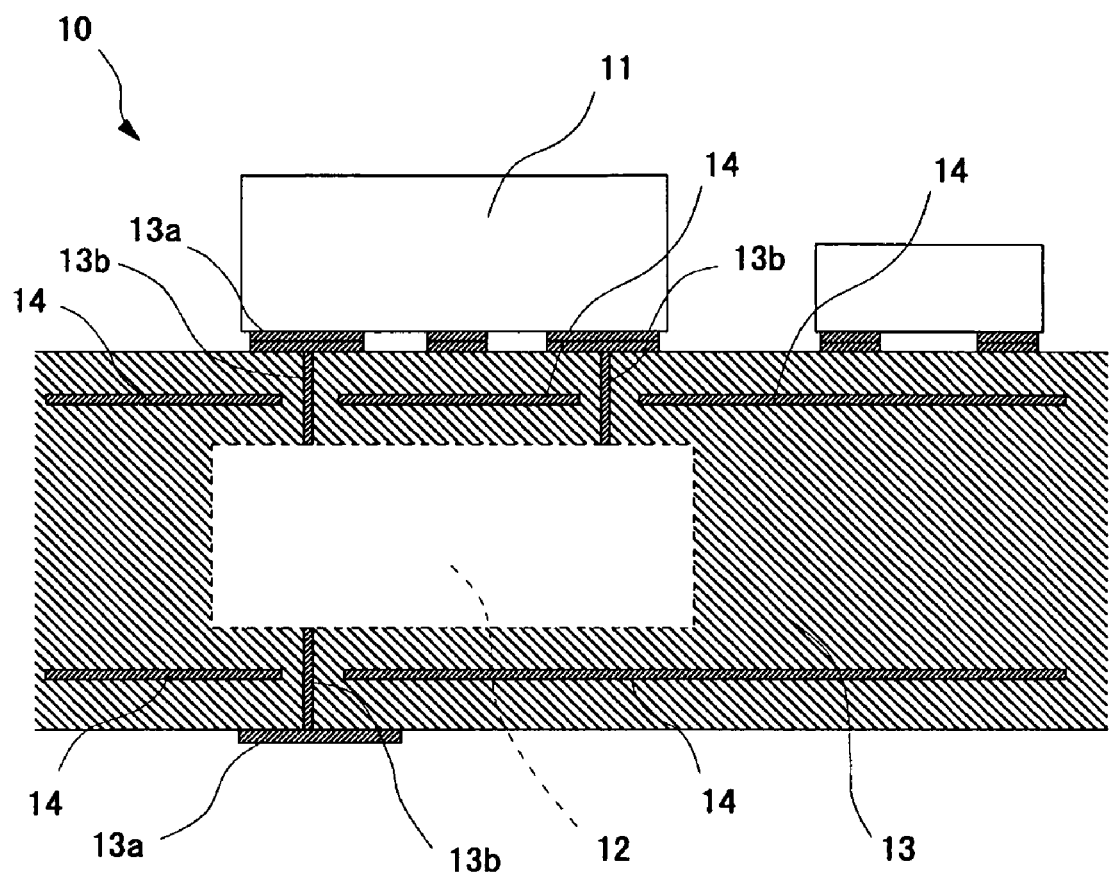
FIG. 1 is a diagram for explanation of a basic configuration of the device.

Hereinafter, one embodiment of the invention will be described by referring to the drawings.

In one embodiment, a high frequency module 10 is configured by dividing a dielectric passive circuit such as a filter that has been formed only in an inner layer of a substrate or a dielectric inner layer circuit formed by a mounting electronic part mounted on the substrate in the conventional method, into a passive circuit 12 formed in an inner layer of a substrate 13 and a passive circuit formed by a mounting electronic part 11 mounted on the substrate 13, connecting these by a land 13a and via conductors 13b, and forming a GND (ground) electrode 14 for shielding between them as shown in FIG. 1. Therefore, a high frequency module capable of reducing the inhibition in magnetic flux generated in an inductor and the increase in stray capacitance and simultaneously attaining shorter height and downsizing can be configured.

Further, in one embodiment, the magnetic flux generated in the inductor is not inhibited by mounting the inductor part as the mounting electronic part 11 on the substrate 13. Thereby, when sealed by a shield case or the like, the clearance between the inductor and the shield part is more easily secured compared to the case where the inductor is formed in inner layer of the substrate 13, and the interference with the magnetic field can be significantly reduced.

As below, a first embodiment will be described as a specific example.

Figure 2:
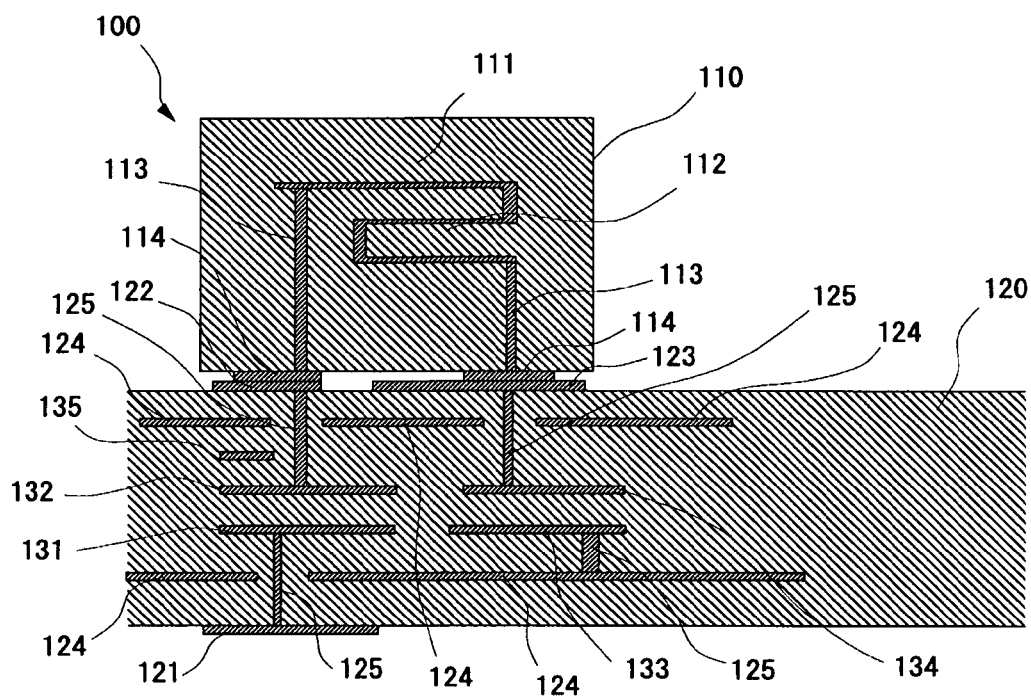
FIG. 2 is a schematic side view of a main part of a high frequency module in the first embodiment of the invention.
Figure 3:
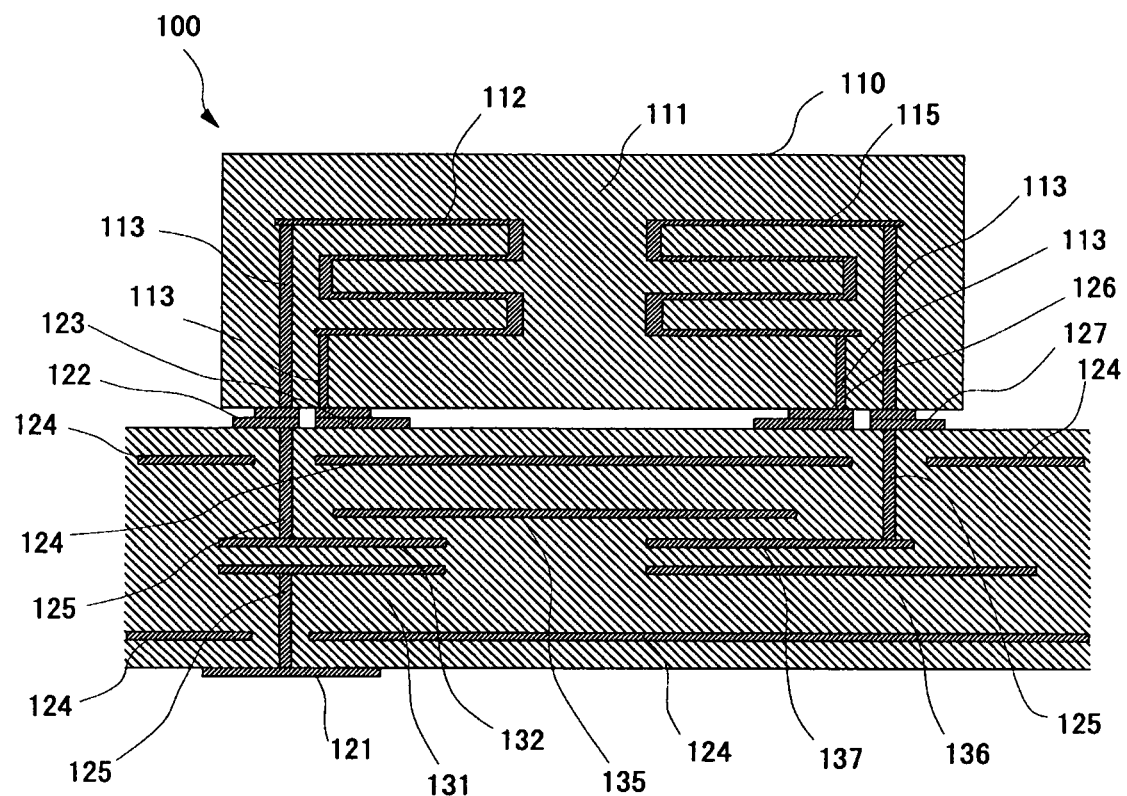
FIG. 3 is a schematic front view of a main part of the high frequency module in the first embodiment of the invention.
Figure 4:
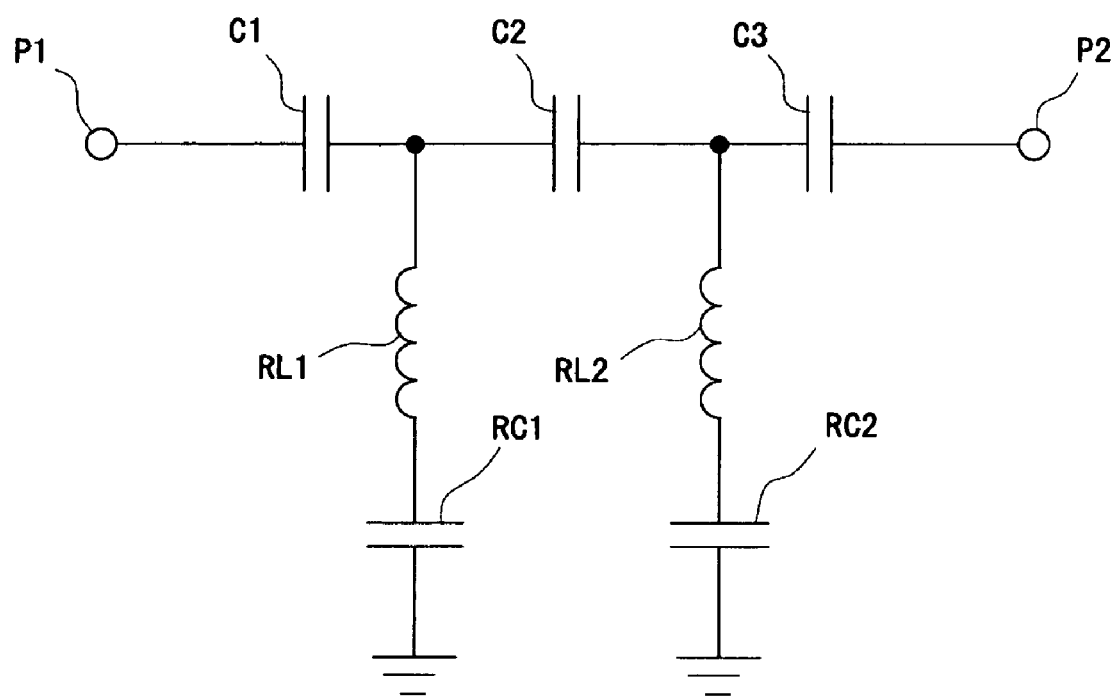
FIG. 4 is an equivalent circuit diagram of the high frequency module in the first embodiment of the invention.

FIGS. 2 to 4 show the first embodiment of the invention. FIG. 2 is a schematic side view of a main part of a high frequency module in the first embodiment, FIG. 3 is a schematic front view of a main part showing a passive circuit part of the high frequency module in the first embodiment, and FIG. 4 is an equivalent circuit diagram of the passive circuit part of the high frequency module in the first embodiment.

In the embodiment, a high frequency module 100 including a bandpass type filter circuit (hereinafter, simply referred to as "filter circuit") shown in FIG. 4 as a passive circuit is configured. Further, in the high frequency module of the first embodiment, as shown in FIGS. 2 and 3, coupling capacitors C1, C2, C3 and capacitors for resonance RC1, RC2 shown in FIG. 4 are formed within a dielectric module substrate (hereinafter, simply referred to as "substrate") 120 in inner layers, inductors for resonance RL1, RL2 are configured as a mounting electronic part 110 and solder-connected to the capacitors C1, C2, C3, RC1, RC2 formed in inner layers, and GND (ground) electrodes 124 that shield the mounting electronic part 110 and the capacitors C1, C2, C3, RC1, RC2 formed within the substrate 120 is formed within the substrate 120.

That is, the mounting electronic part 110 has a stripline electrode 112 that forms the inductor for resonance RL1 within an element main body 111 formed by dielectric ceramics and a stripline electrode 115 that forms the inductor for resonance RL2, and the respective both ends of these stripline electrodes 112, 115 are connected to an external terminal electrode 114 formed on the outer surface of the element main body 110 through via conductors 113.

Further, capacitor electrodes 131 to 137 and GND (ground) electrodes 124 that form the coupling capacitors C1, C2, C3 and the capacitors for resonance RC1, RC2 are formed within the dielectric module substrate 120, and connected to land electrodes 121 to 123, 126, 127 formed on the surface of the dielectric module substrate 120 through via conductors 125 according to need. Further, the GND (ground) electrodes 124 are formed so as to sandwich the capacitor electrodes 131 to 137, and the GND (ground) electrodes 124 at the upper layer side in the drawing shield between the mounting electronic part 110 and the capacitor electrodes 131 to 137.

In the above described configuration, the coupling capacitor C1 is formed by the capacitor electrodes 131, 132, a part of the coupling capacitor C2 is formed by the capacitor electrodes 132, 135, another part of the coupling capacitor C2 is formed by the capacitor electrodes 135, 137, and the coupling capacitor C3 is formed by the capacitor electrodes 137, 136. Further, the capacitor for resonance RC1 is formed by the capacitor electrodes 133, 134, and the capacitor for resonance RC2 is similarly formed by capacitor electrodes (not shown).

In the high frequency module of the embodiment having the above described configuration, the filter circuit as a passive circuit is divided and formed within the substrate 120 and in the mounting electronic part 110 mounted on the substrate 120. Therefore, a passive circuit that utilizes the entire thickness of the module can be formed, and the module has a characteristic improvement effect by utilizing the thickness of the entire module for the circuit configuration part such as a stripline resonator that especially and highly depends on the dielectric material thickness compared to the conventional method of forming the passive circuit only with a substrate inner layer or mounting electronic part.

Further, because of the characteristics of the parts that form the filter circuit as the passive circuit as shown in the embodiment, the inductor for resonances RL1, RL2 are configured as the mounting electronic part 110, and therefore, the structural influence by stray capacitance or the like can be reduced.

Note that, according to the device, the configuration elements that realize the circuit configuration in FIG. 4 can be freely arranged either within the module substrate or in the mounting electronic part, and thereby, the degree of freedom of design can be improved.

Although the filter circuit as a passive circuit is divided and formed within the substrate 120 and in the mounting electronic part 110 in the above first embodiment, the passive circuit is not limited to that, and, needless to add, the same effect can be obtained in the case of a passive circuit other than a filter circuit.

Next, the second embodiment of the invention will be described.

An equal height to those of other mounting electronic parts such as a capacitor, quartz resonator, and semiconductor is required for a chip type balance filter conventionally used for radio equipment, which is composite for reduction in the number of parts, and securing of characteristics becomes difficult by thinning because it has a structure in which a balun unit and a filter unit are compositely formed. In the case where they are developed in a plane for securing of characteristics, the area of the circuit increases, and thereby, the cost is increased and the area of the radio equipment is increased.

Figure 5:
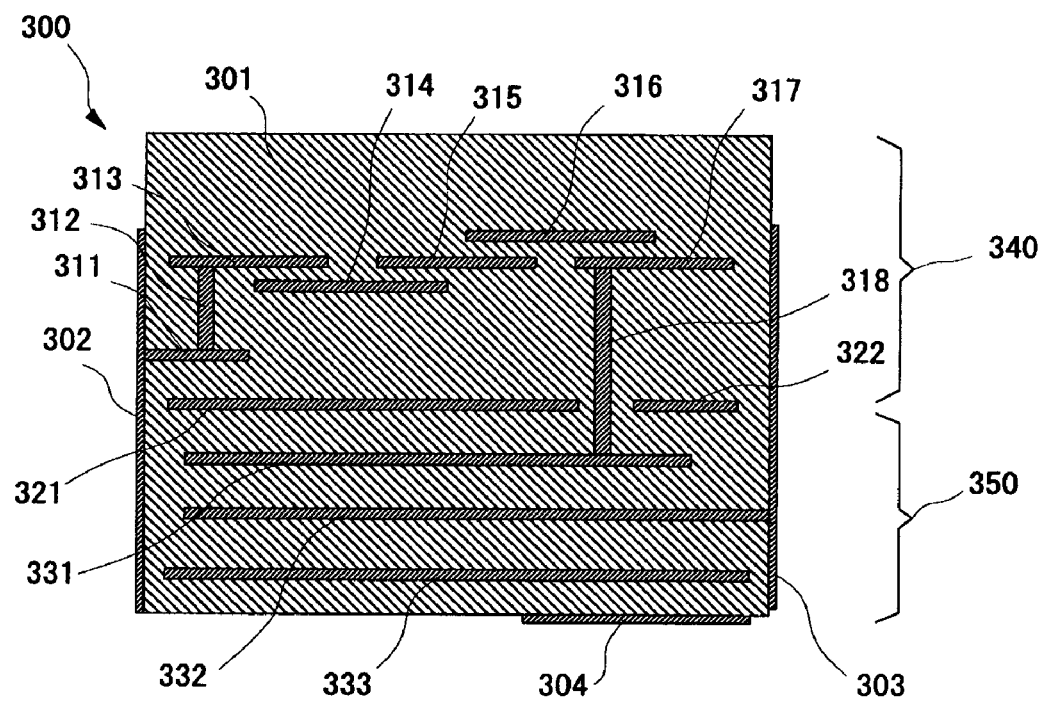
FIG. 5 is a schematic side sectional view showing a chip type balance filter element of a conventional example.
Figure 6:
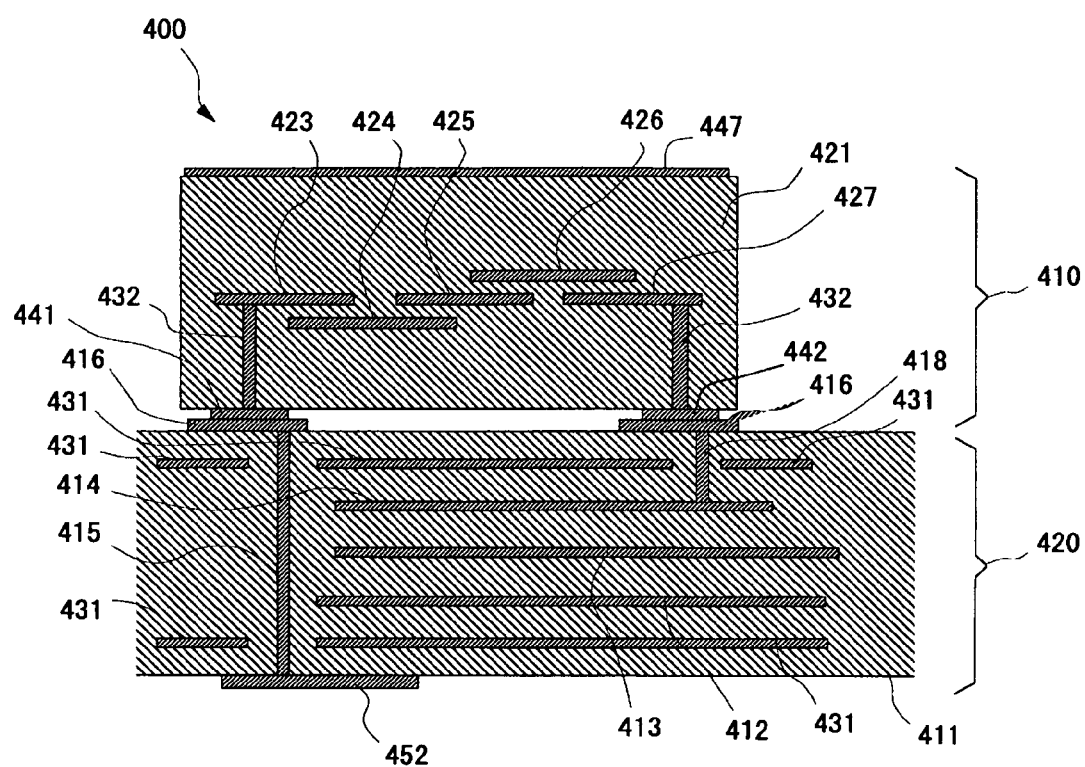
FIG. 6 is a schematic side view of a main part of a high frequency module in the second embodiment of the invention.
Figure 7:
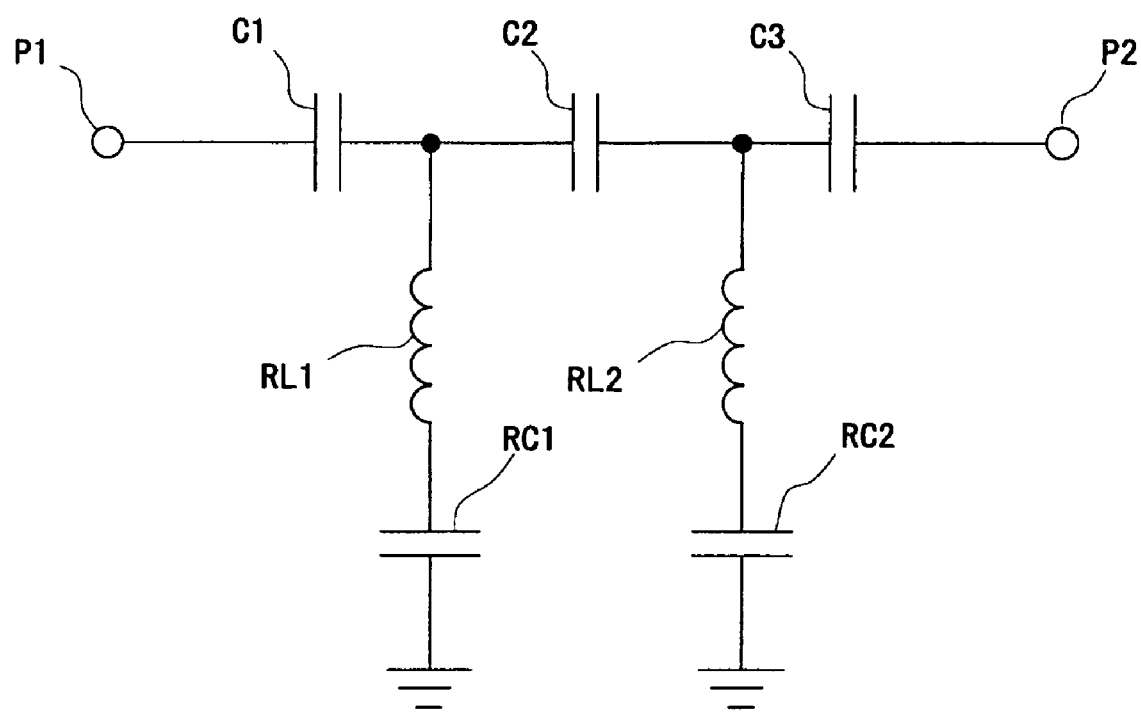
FIG. 7 is a circuit diagram showing a bandpass type filter in the conventional example.
Figure 8:
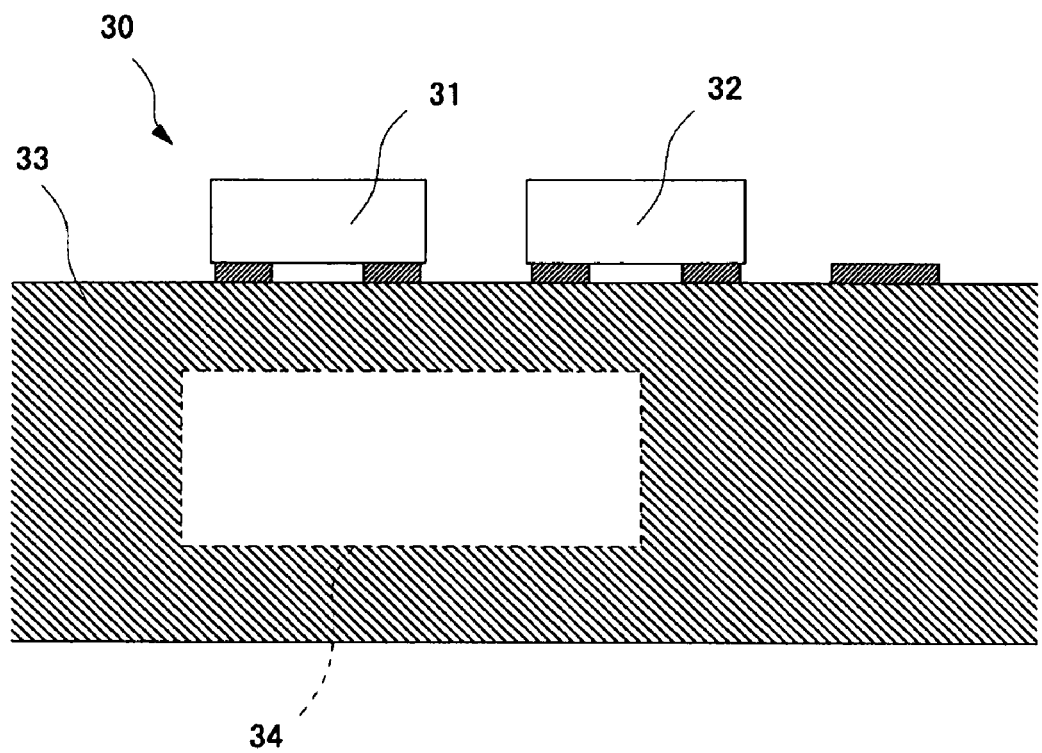
FIG. 8 is a diagram for explanation of a configuration example of a high frequency module in the conventional example.
Figure 9:
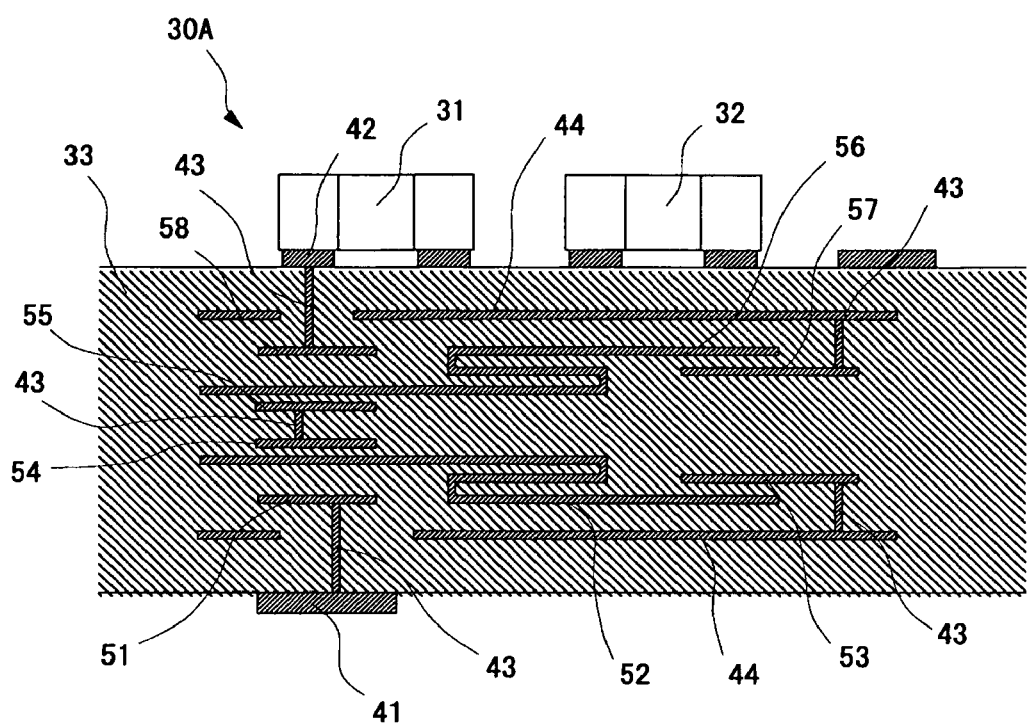
FIG. 9 is a diagram for explanation of a configuration example of a high frequency module in the conventional example.
Figure 10:
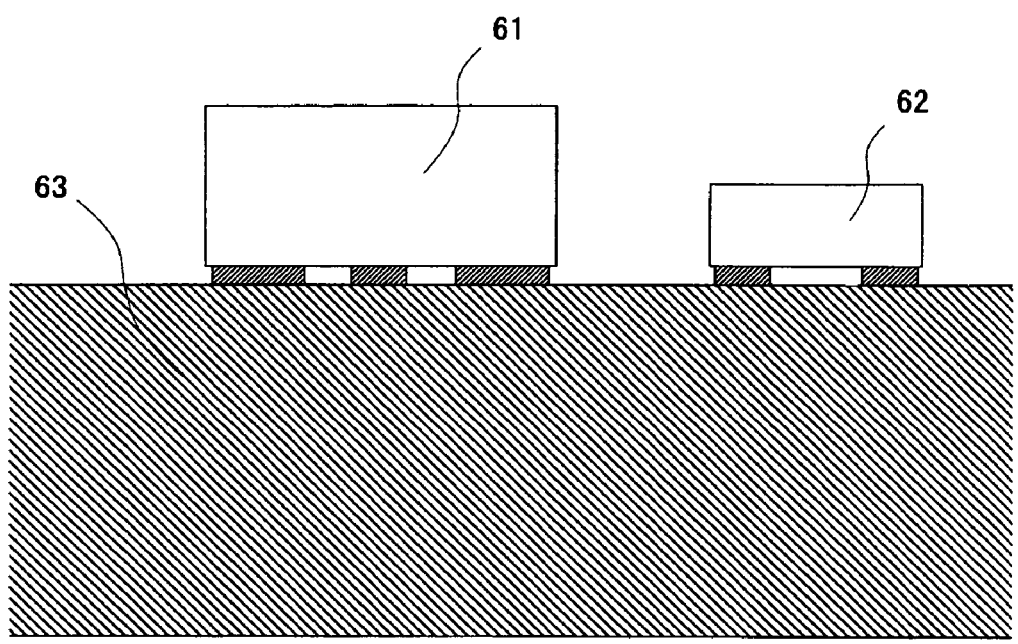
FIG. 10 is a diagram for explanation of a configuration example of a high frequency module in the conventional example.

In the second embodiment, a high frequency module 400 in which a balance filter 300 conventionally formed as a chip type mounting electronic part 300 having a filter unit 310 and a balun unit 320 as shown in FIG. 5 is divided into a balun unit 410 and a filter unit 420 as shown in FIG. 6, the filter unit 420 is configured as a mounting electronic part 421 and the balun unit 410 is formed within a dielectric module substrate (hereinafter, simply referred to as "substrate") 411 is formed.

The balance filter element 300 of the conventional example as shown in FIG. 5 has external terminal electrodes 302 to 304 formed on the outer surface of a ceramics element 301 and the filter unit 310 and the balun unit 320 within the ceramics element. The filter unit 310 includes plural electrodes 311, 313 to 317 and a via conductor 312, the balun unit 320 includes plural electrodes 331 to 333, and the electrode 317 of the filter unit 310 and the electrode 331 of the balun unit 320 are connected through a via conductor 318. Further, GND (ground) electrodes 321, 322 are located between the filter unit 310 and the balun unit 320 and thereby shield between the filter unit 310 and the balun unit 320.

In the high frequency module 400 shown in FIG. 6, the mounting electronic part 421 includes a ceramics element, plural electrodes 423 to 427 that form a filter and a via conductor 432 are provided within the element, and external terminal electrodes 441, 442 are formed on the element surface. Furthermore, the external terminal electrode 441 is connected to the electrode 423 through the via conductor 432 and the electrode 427 is connected to the external terminal electrode 442 through the via conductor 432.

Further, an external terminal electrode 452 and land electrodes 416, 416 are formed on the surface of the substrate 411, and plural electrodes 412 to 414 that form the balun unit 410 and GND (ground) electrodes 431 located in both upper layer part and lower layer part are located so as to sandwich these electrodes are provided within the substrate 411. Furthermore, the external terminal electrode 452 is connected to the land electrode 416 through a via conductor 415, and the electrode 414 is connected to the land electrode 416 through a via conductor 418.

The two external terminal electrodes 441, 442 of the mounting electronic part 421 are connected to the land electrodes 416, 416 provided on the surface of the substrate 411, respectively.

As described above, the balance filter is distributed and configured within the module substrate 411 and in the mounting electronic part 421, and therefore, the thicknesses of the circuit devices can be increased, the filter can be designed in consideration of impedance matching etc., and the advantage of the complex balance filter that reduces the number of parts is hardly lost, compared to the conventional method of forming a balance filter as the passive circuit only with a substrate inner layer of the substrate 411 or mounting electronic part.

Although the LC resonance circuit and the balance filter circuit have been shown as the passive circuits in the embodiments, the embodiment is not limited to those but the passive circuit may be an LCR composite resonance circuit in place of the LC resonance circuit.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A high frequency device comprising a passive circuit having an inductor and a capacitor, the passive circuit comprising:
   one component part mounted on the substrate,
   another component part formed within the substrate, and
   a ground electrode provided between the one component part and the other component part.

2. The device according to claim 1, wherein the passive circuit comprises a filter circuit having an LC resonance circuit.

3. The device according to claim 2, wherein the one component part comprises at least part of an inductor that forms the LC resonance circuit.

4. The device according to claim 1, wherein the passive circuit comprises a balance filter circuit having a distributed constant type resonator.

5. The device according to claim 4, wherein the one component part comprises at least part of the distributed constant type resonator that forms the balance filter circuit.

6. The device according to claim 1, wherein the substrate comprises a dielectric ceramic substrate.

7. A method of making a high frequency device comprising a passive circuit having an inductor and a capacitor, the method comprising:
   forming a component part of the passive circuit within a substrate;
   forming another part of the passive circuit by mounting an electronic part on the substrate; and
   providing a ground electrode between the one component part and the other component part.

8. The method according to claim 7, wherein the passive circuit comprises a filter circuit having an LC resonance circuit.

9. The method according to claim 7, wherein the passive circuit comprises a balance filter circuit having a distributed constant type resonator.

10. The device according to claim 7, wherein the substrate comprises a dielectric ceramic substrate.

11. A high frequency device comprising a passive circuit having an inductor and a capacitor, the passive circuit comprising:
    one component part mounted on the substrate,
    another component part formed within the substrate, and
    means for shielding the one component part from the other component part.

12. The device of claim 11, wherein the means for shielding is formed within the substrate.

13. The device according to claim 11, wherein the passive circuit comprises an LC resonance circuit.

14. The device according to claim 11, wherein the means for shielding comprises a ground electrode provided between the one component part and the other component part.

15. The device according to claim 1, wherein the ground electrode is formed between the one component part and the other component part to provide shielding between the one component part and the other component part.

16. The device of claim 1, wherein the ground electrode is formed within the substrate.

17. The device of claim 7, wherein the ground electrode is formed within the substrate.

* * * * *